US009413994B2

(12) United States Patent
Shimizu

(10) Patent No.: US 9,413,994 B2
(45) Date of Patent: Aug. 9, 2016

(54) SOLID-STATE IMAGING DEVICE AND IMAGING APPARATUS

(71) Applicant: Panasonic Corporation, Osaka (JP)

(72) Inventor: Yusuke Shimizu, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 243 days.

(21) Appl. No.: 14/299,345

(22) Filed: Jun. 9, 2014

(65) Prior Publication Data

US 2014/0284453 A1 Sep. 25, 2014

Related U.S. Application Data

(63) Continuation of application No. PCT/JP2012/007184, filed on Nov. 8, 2012.

(30) Foreign Application Priority Data

Dec. 16, 2011 (JP) .................................. 2011-275408

(51) Int. Cl.
*H04N 5/376* (2011.01)
*H04N 5/357* (2011.01)
(Continued)

(52) U.S. Cl.
CPC ........ *H04N 5/357* (2013.01); *H03K 19/017536* (2013.01); *H04N 5/3698* (2013.01); *H04N 5/372* (2013.01); *H04N 5/3765* (2013.01)

(58) Field of Classification Search
CPC ..... H04N 5/357; H04N 5/3698; H04N 5/372; H04N 5/3765; H03K 19/017536

USPC ..................... 250/208.1; 349/39, 46
See application file for complete search history.

(56) References Cited

U.S. PATENT DOCUMENTS 7,471,286 B2    12/2008   Chung
7,515,185 B2     4/2009   Nakamura et al.
(Continued)

FOREIGN PATENT DOCUMENTS

JP      2005-5688      1/2005
JP      2005-20553     1/2005
(Continued)

OTHER PUBLICATIONS

International Search Report issued Feb. 5, 2013 in corresponding International Application No. PCT/JP2012/007184.

*Primary Examiner* — Renee D Chavez
(74) *Attorney, Agent, or Firm* — Wenderoth, Lind & Ponack, L.L.P.

(57) ABSTRACT

A solid-state imaging device according to the present disclosure includes: a pixel unit in which unit pixels are arranged two-dimensionally, each of the unit pixels including: a photodiode which stores signal charges; a transfer transistor for transferring the signal charges stored in the photodiode; a charge detection unit which temporarily stores the transferred signal charges; and a reset transistor for resetting the signal charges stored in the charge detection unit; and a vertical scanning unit which drives the pixel unit, the vertical scanning unit including: a row selection unit; a level shift circuit for converting a level of an externally inputted power supply voltage; and a buffer circuit for buffering a voltage whose level has been converted by the level shift circuit, the level shift circuit including: a step-down level shift circuit; and a step-up level shift circuit isolated from the step-down level shift circuit by a well.

7 Claims, 11 Drawing Sheets

(51) Int. Cl.
*H04N 5/369* (2011.01)
*H03K 19/0175* (2006.01)
*H04N 5/372* (2011.01)

(56) References Cited

U.S. PATENT DOCUMENTS

2005/0057481 A1  3/2005  Chung
2005/0224841 A1  10/2005  Nakamura et al.
2011/0193616 A1  8/2011  Amanuma et al.
2013/0076430 A1  3/2013  Amanuma et al.

FOREIGN PATENT DOCUMENTS

| | | |
|---|---|---|
| JP | 2005-92209 | 4/2005 |
| JP | 2008-124229 | 5/2008 |
| JP | 2011-165732 | 8/2011 |
| WO | 03/085964 | 10/2003 |

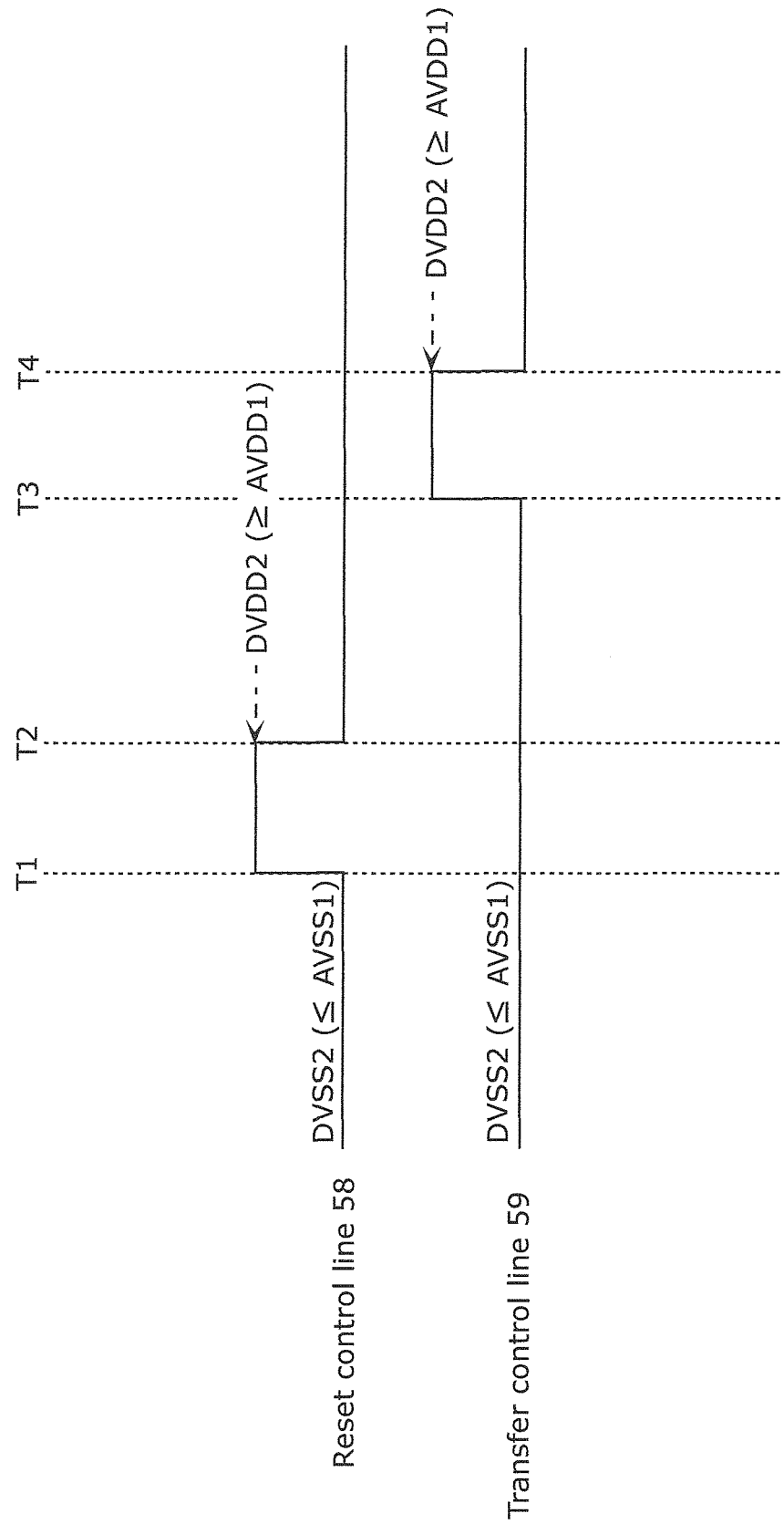

SOLID-STATE IMAGING DEVICE AND IMAGING APPARATUS

CROSS REFERENCE TO RELATED APPLICATION(S)

This is a continuation application of PCT International Application No. PCT/JP2012/007184 filed on Nov. 8, 2012, designating the United States of America, which is based on and claims priority of Japanese Patent Application No. 2011-275408 filed on Dec. 16, 2011. The entire disclosures of the above-identified applications, including the specifications, drawings and claims are incorporated herein by reference in their entirety.

FIELD

The present invention relates to a solid-state imaging device and an imaging apparatus.

BACKGROUND

A solid-state imaging device in the conventional art will be described with reference to FIG. 11.

In a pixel unit, unit pixels 1055 are arranged two-dimensionally. Each of the unit pixels 1055 includes a photodiode 1023, a transfer transistor (transfer gate TG) 1018, a charge detection unit (FD unit) 1017, an amplifier transistor 1056, an analog power supply terminal (AVDD1) 1040, a selection (address) transistor 1057, and a vertical signal line 1059.

Moreover, a vertical driving unit 1006 for driving the pixel unit includes a vertical register unit 1064 for sequentially selecting rows of pixels and level shift circuit units 1061, 1062, and 1063 for shifting the level of an address signal from the vertical register unit 1064, using a power supply voltage.

The level shift circuit units 1061, 1062, and 1063 respectively control the gate voltages of the selection transistor 1057, a reset transistor 1016, and the transfer transistor 1018. Specifically, the level shift circuits 1061, 1062, and 1063 respectively apply control pulses φA (for selection) 1060, φR (for reset) 1022, and φTG (for a transfer gate) 1021 to the transistors of the unit pixel 1055.

Moreover, a voltage greater than a power supply voltage DVDD1 needs to be applied to the transfer transistor 1018 and the selection transistor 1057. Therefore, the level shift circuit units 1061 and 1063 each supply a power supply voltage DVDD2 greater than DVDD1.

CITATION LIST

Patent Literature

[PTL 1] WO 03/085964

SUMMARY

Technical Problem

However, the conventional solid-state imaging device illustrated in FIG. 11 has the following problem. An increase in potential differences between the control pulses φR (for reset), φTG (for transfer gate), and φA (for selection) to expand the operation margin of a pixel increases currents (through-currents) flowing through the level shift circuits 1061, 1062, and 1063. This causes the degradation of image quality due to a random noise.

In view of the above problem, the present invention provides a solid-state imaging device and an imaging apparatus which can expand the operation margin of a pixel without degrading image qualify due to a random noise.

Solution to Problem

To solve the above problem, a solid-state imaging device according to an aspect of the present invention includes: a pixel unit in which unit pixels are arranged in rows and columns on a semiconductor substrate, each of the unit pixels including, on the semiconductor substrate: a receiving unit which stores signal charges obtained by photoelectrically converting incident light; a transfer transistor for transferring the signal charges stored in the receiving unit, in accordance with a pulse signal applied to a gate electrode of the transfer transistor; a charge detection unit which temporarily stores the transferred signal charges; and a reset transistor for resetting the signal charges stored in the charge detection unit, in accordance with a pulse signal applied to a gate electrode of the reset transistor; and a vertical scanning unit formed in and on the semiconductor substrate which drives the pixel unit by supplying the pulse signal to the pixel unit, the vertical scanning unit including: a row selection unit which selects one of the rows of the unit pixels; at least one level shift circuit for converting a level of an externally inputted power supply voltage, the level being a single voltage level; and at least one buffer circuit for buffering a voltage whose level has been converted by the at least one level shift circuit, and transferring the buffered voltage as the pulse signal to the pixel unit, each of the at least one level shift circuit including: a step-down level shift circuit which steps down an externally inputted power supply voltage; and a step-up level shift circuit which is isolated from the step-down level shift circuit by a well, and steps up an externally inputted power supply voltage.

Moreover, the vertical scanning unit may include: a first level shift circuit of the at least one level shift circuit and a first buffer circuit of the at least one buffer circuit, the first buffer circuit supplying, as the pulse signal, a voltage whose level has been converted by the first level shift circuit, to the gate electrode of the transfer transistor, the first level shift circuit and the first buffer circuit being disposed between the row selection unit and the gate electrode of the transfer transistor; and a second level shift circuit of the at least one level shift circuit and a second buffer circuit of the at least one buffer circuit, the second buffer circuit supplying, as the pulse signal, a voltage whose level has been converted by the second level shift circuit, to the gate electrode of the reset transistor, the second level shift circuit and the second buffer circuit being disposed between the row selection unit and the gate electrode of the reset transistor, and the first level shift circuit may be disposed closer to the row selection unit than the second level shift circuit is.

Moreover, a voltage amplitude of the pulse signal supplied from the first buffer circuit to the gate electrode of the transfer transistor may be set to be greater than a voltage amplitude of the pulse signal supplied from the second buffer circuit to the gate electrode of the reset transistor.

Moreover, the pixel unit may further include, on the semiconductor substrate, selection transistors for determining an output timing of a pixel signal to one of vertical signal lines respectively provided for the columns of the unit pixels, in accordance with a pulse signal applied to a gate electrode of each of the selection transistors, the pixel signal corresponding to the signal charges stored in the charge detection unit, the vertical scanning unit may include a third level shift circuit of the at least one level shift circuit and a third buffer circuit of the at least one buffer circuit, the third level shift circuit and the third buffer circuit being disposed between the row selection unit and the gate electrode of the selection transistor, the first level shift circuit may be disposed closer to the row selection unit than the second level shift circuit and the third level shift circuit are, and the third level shift circuit may be disposed closer to the pixel unit than the first level shift circuit and the second level shift circuit are.

Moreover, a voltage amplitude of the pulse signal supplied from the first level shift circuit and the first buffer circuit to the gate electrode of the transfer transistor may be set to be greater than a voltage amplitude of the pulse signal supplied from the second level shift circuit and the second buffer circuit to the gate electrode of the reset transistor and a voltage amplitude of the pulse signal supplied from the third level shift circuit and the third buffer circuit to the gate electrode of the selection transistor.

Moreover, the step-down level shift circuit, the step-up level shift circuit, and the at least one buffer circuit may be disposed in sequence in a direction from the row selection unit toward the unit pixels.

Moreover, the present invention can be not only achieved as a solid-state imaging device including the above characteristic units, but also achieved as an imaging apparatus including the above solid-state imaging device.

Advantageous Effects

The solid-state imaging device according to the present invention can prevent the degradation of image quality due to a random noise while expanding the operation margin of a pixel.

BRIEF DESCRIPTION OF DRAWINGS

These and other objects, advantages and features of the invention will become apparent from the following description thereof taken in conjunction with the accompanying drawings that illustrate a specific embodiment of the present invention.

FIG. 8 is a timing chart for a solid-state imaging device according to Embodiment 2.

DESCRIPTION OF EMBODIMENTS

Each embodiment will be described in detail with reference to the drawings.

It should be noted that all of the embodiments below illustrate a general or specific example. Numerical values, shapes, structural elements, the arrangement and connection of the structural elements, and others shown in the following embodiments are mere examples, and are not intended to limit the present invention. Moreover, among the structural elements in the following embodiments, the structural elements not recited in the independent claims representing superordinate concept are described as arbitrary structural elements.

Embodiment 1

Figure 1:
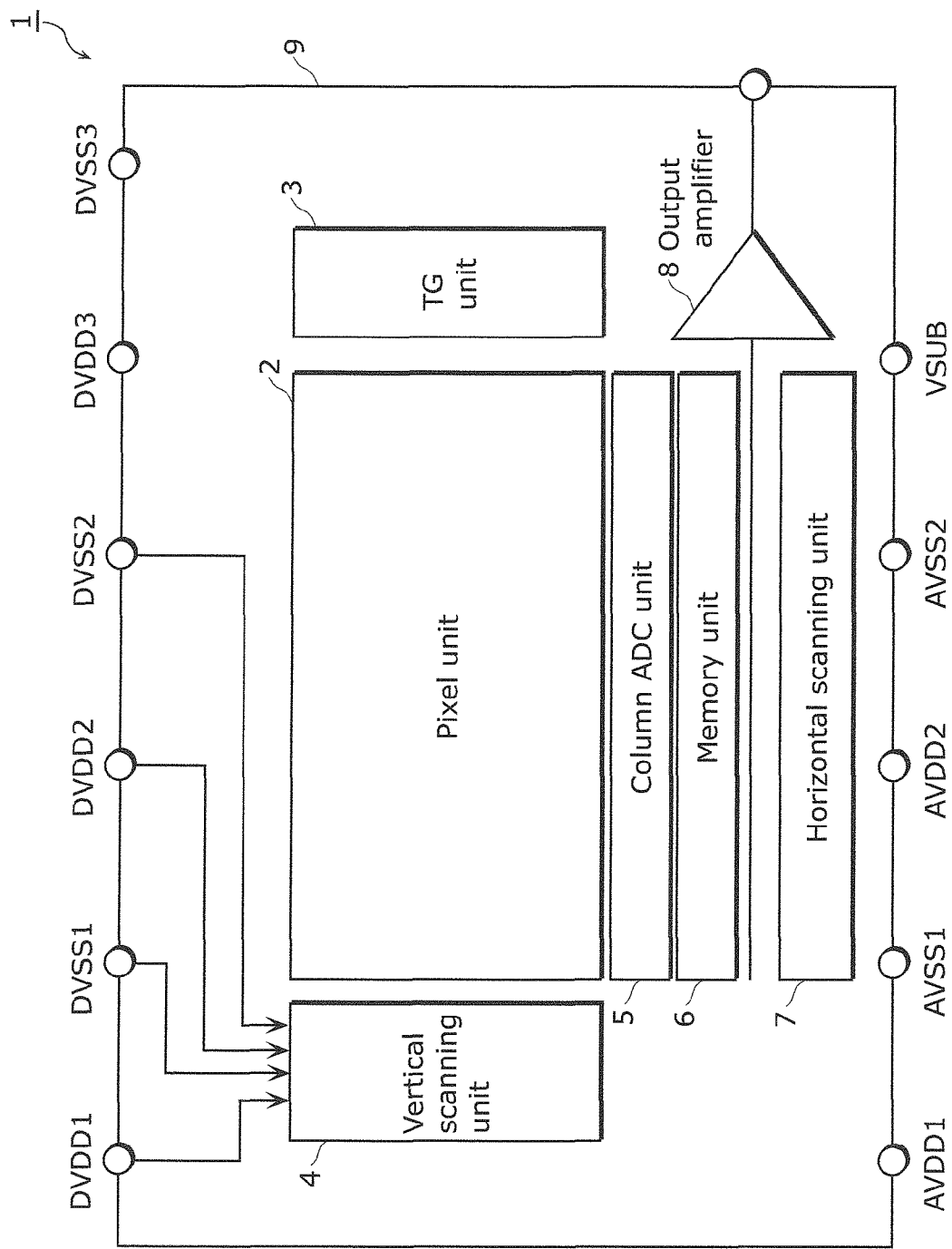
FIG. 1 illustrates an entire configuration of a solid-state imaging device according to Embodiment 1.

FIG. 1 illustrates an entire configuration of a solid-state imaging device according to Embodiment 1. In FIG. 1, a solid-state imaging device 1 includes a pixel unit 2, a column ADC unit 5, a memory unit 6, a horizontal scanning unit 7, and an output amplifier 8. In the pixel unit 2, unit pixels 10 (illustrated in FIGS. 2 and 4) are arranged two-dimensionally on a semiconductor substrate 9. The column ADC unit 5 converts an analog signal outputted from the pixel unit 2 into a digital signal. The memory unit 6 temporarily stores the digital signal obtained through the conversion by the column ADC unit 5. The horizontal scanning unit 7 sequentially and horizontally selects and outputs data stored in the memory unit 6. The output amplifier 8 buffers a signal read from the memory unit 6. Moreover, the solid-state imaging device 1 includes, as peripheral circuits, a vertical scanning unit 4 for selecting and driving each of rows of pixels and a timing generator unit (TG unit) 3 for generating a timing signal for each functional block.

Moreover, a digital power supply voltage DVDD1, a digital ground voltage DVSS1, a digital power supply voltage DVDD2, and a digital ground voltage DVSS2 are supplied to the vertical scanning unit 4 via external input terminals. Moreover, an analog power supply voltage AVDD1 and an analog ground voltage AVSS1 are supplied to the pixel unit 2 via external input terminals. Moreover, a digital power supply voltage DVDD3, a digital ground voltage DVSS3, an analog power supply voltage AVDD2, and an analog ground voltage AVSS2 are supplied to the other peripheral circuit via external input terminals. Moreover, a VSUB voltage is supplied to the solid-state imaging device 1 via an external input terminal.

It should be noted that the digital power supply voltage DVDD1 and the digital power supply voltage DVDD3 are, for example, 1.2 V. The digital power supply voltage DVDD2, the analog power supply voltage AVDD1, and the analog power supply voltage AVDD2 are, for example, 2.8 V. This reduces a voltage in a digital camera or a mobile phone so that a battery lasts long.

Figure 2:
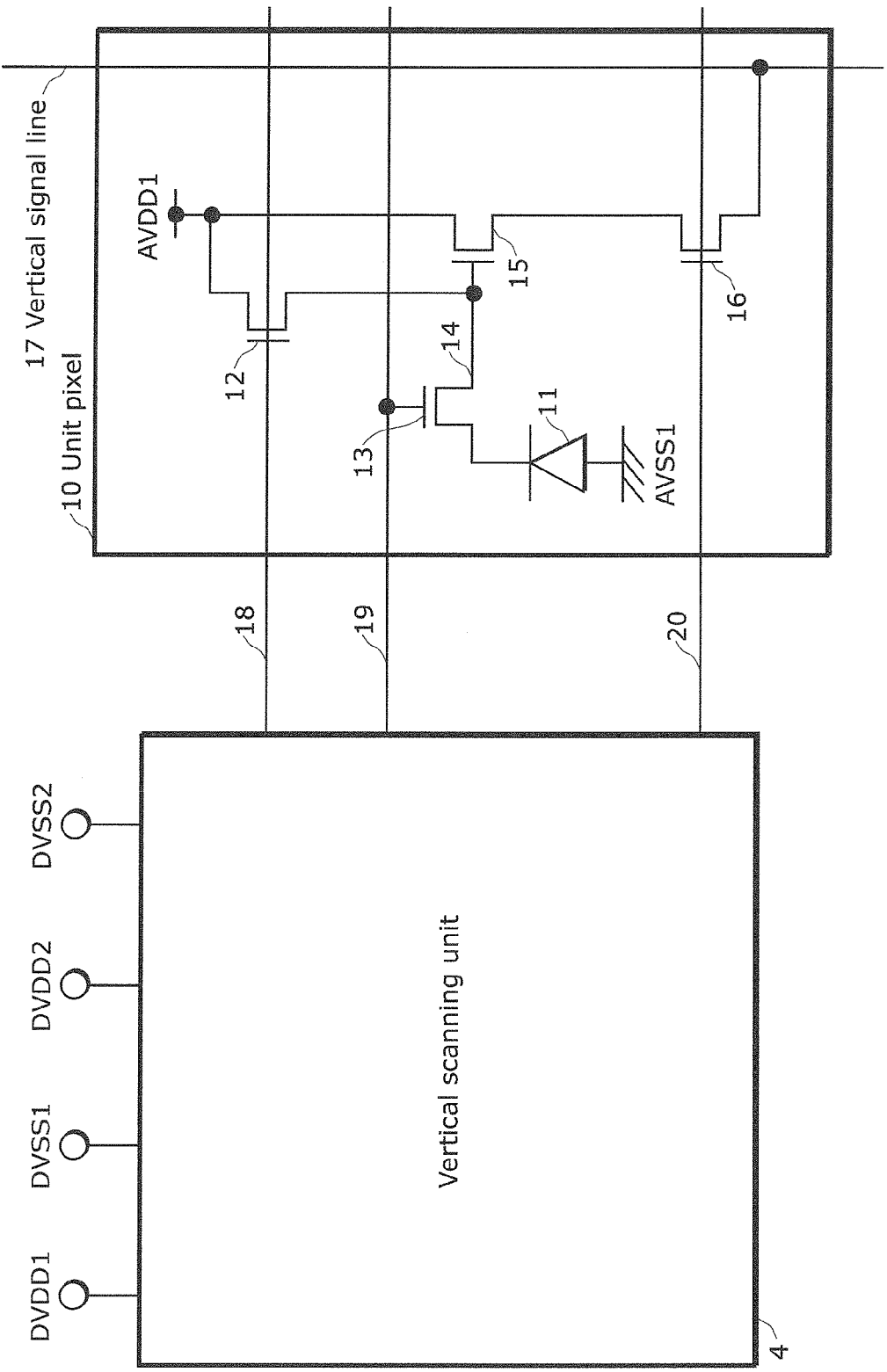
FIG. 2 is a detailed block diagram illustrating a unit pixel and the vertical scanning unit of a solid-state imaging device according to Embodiment 1.

FIG. 2 is a detailed block diagram illustrating a unit pixel and the vertical scanning unit of the solid-state imaging device according to Embodiment 1. In FIG. 2, a unit pixel 10 includes a photodiode (receiving unit) 11, a transfer transistor 13, a charge detection unit 14, an amplifier transistor 15, a selection transistor 16, a reset transistor 12 for resetting the potential of the charge detection unit 14, a vertical signal line 17, a terminal to which the analog power supply voltage AVDD1 is supplied, and a terminal to which the analog ground voltage AVSS1 is supplied.

The photodiode (receiving unit) 11 stores signal charges obtained by photoelectrically converting incident light.

The selection transistor 16 determines the timing when a pixel signal corresponding to the signal charges stored in the charge detection unit 14 are outputted to the vertical signal line 17 provided for each of the columns of pixels in accordance with a pulse signal applied to the gate electrode.

The transfer transistor 13 transfers the signal charges stored in the photodiode 11, in accordance with a pulse signal applied to the gate electrode.

The charge detection unit 14 temporarily stores the signal charges transferred by the transfer transistor 13.

The reset transistor 12 resets the signal charges stored in the charge detection unit 14, in accordance with a pulse signal applied to the gate electrode.

Moreover, the vertical scanning unit 4 generates a reset control signal, a transfer control signal, and a scanning signal. The reset control signal controls the reset transistor 12 via a reset control line 18. The transfer control signal controls the transfer transistor 13 via a transfer control line 19. The scanning signal controls the selection transistor 16 via a row selection line 20. The vertical scanning unit 4 drives the pixel unit 2 by supplying, to the pixel unit 2, the reset control signal, transfer control signal, and scanning signal, as pulse signals.

Moreover, the relationship between the digital power supply voltage DVDD1 and the digital power supply voltage DVDD2, which are supplied to the vertical scanning unit 4 is DVDD1<DVDD2. The relationship between the digital ground voltage DVSS1 and the digital ground voltage DVSS2, which are supplied to the vertical scanning unit 4 is DVSS2≤DVSS1.

Moreover, the relationship between the digital power supply voltage DVDD2 and the analog power supply voltage AVDD1 is DVDD2≥AVDD1. The relationship between the digital ground voltage DVSS2 and the analog ground voltage AVSS1 is DVSS2≤AVSS1.

Figure 3:
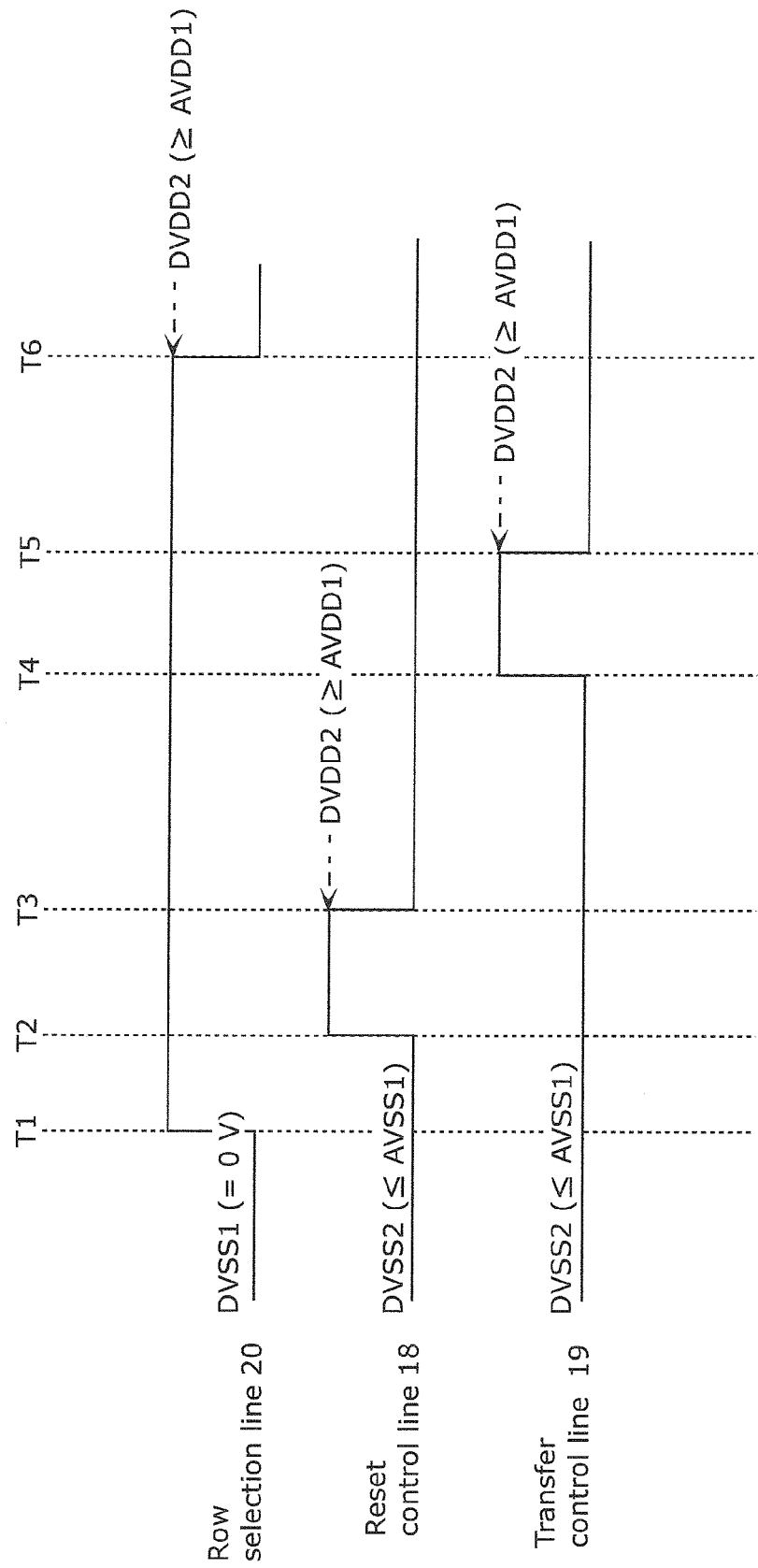
FIG. 3 is a drive timing chart for a solid-state imaging device according to Embodiment 1.

FIG. 3 is a drive timing chart for the solid-state imaging device according to Embodiment 1. Specifically, FIG. 3 is a timing chart relating to the reset control line 18, the transfer control line 19, and the row selection line 20 illustrated in FIG. 2.

In pixel read operation, at time T1, scanning signals to be applied to the gate electrodes of the selection transistors 16 are set to DVDD2 (≥AVDD1), to select pixels.

Reset control signals to be applied to the gate electrodes of the reset transistors 12 are set to DVDD2 (≥AVDD1) at time T2, and are set to DVSS2 (≤AVSS1) at time T3. A voltage change in the reset control line 18 from time T2 to time T3 resets the voltages of the charge detection units 14 to be identical to AVDD1.

Transfer control signals to be applied to the gate electrodes of the transfer transistors 13 are set to DVDD2 (≥AVDD1) at time T4, and are set to DVSS2 (≤AVSS1) at time 15. A voltage change in the transfer control line 19 from time T4 to time T5 reads signals from the photodiodes 11.

At time T6, scanning signals to be applied to the gate electrodes of the selection transistors 16 in a row of pixels where the read operation is completed are set to DVSS1. The pixel read operation is performed by a series of operations described above.

Figure 4:
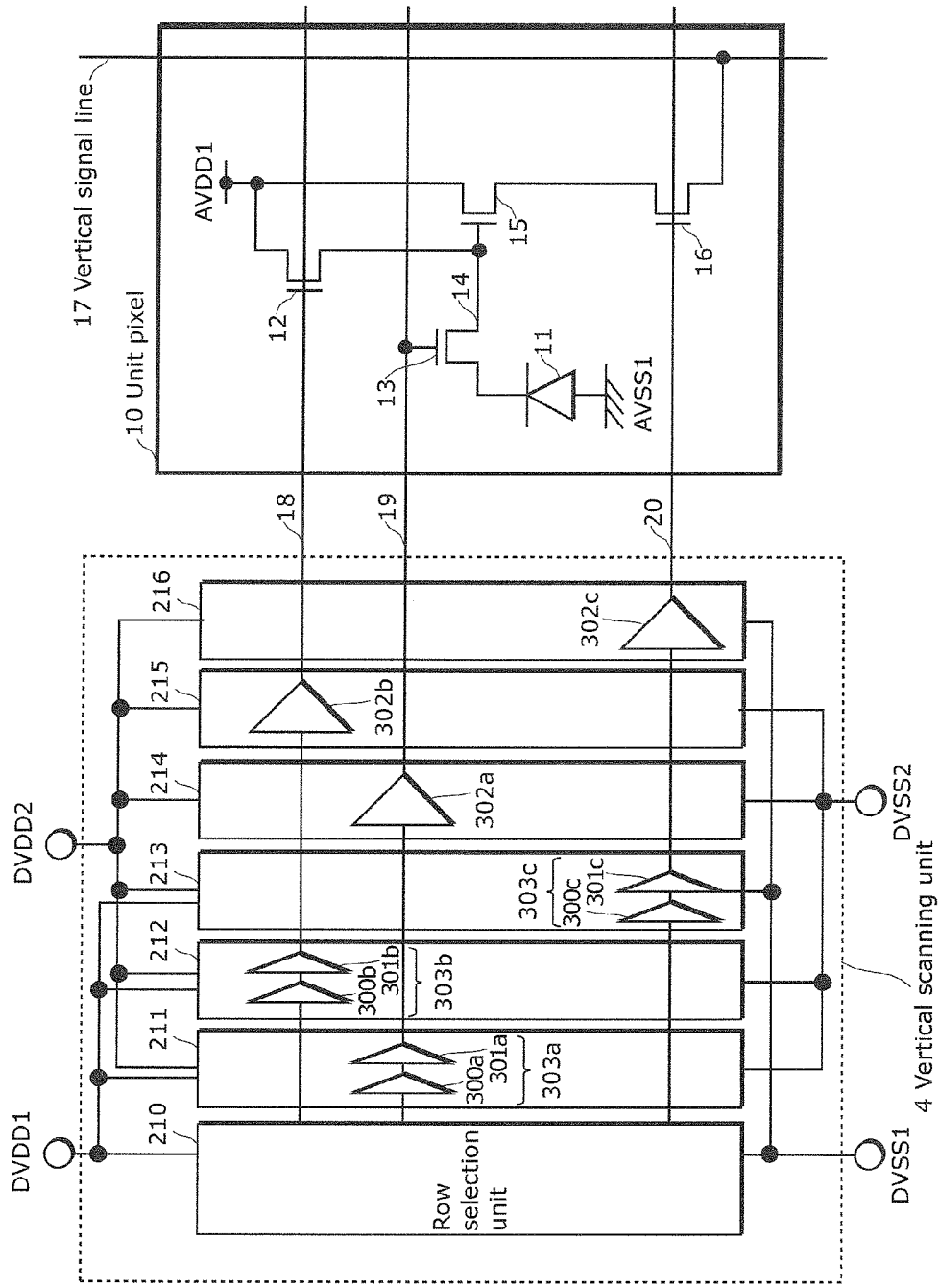
FIG. 4 is a detailed block diagram illustrating a unit pixel and the vertical scanning unit of a solid-state imaging device according to Embodiment 1.

FIG. 4 is a detailed block diagram illustrating a unit pixel and the vertical scanning unit of the solid-state imaging device according to Embodiment 1. Specifically, FIG. 4 is a block diagram of the vertical scanning unit 4 and the unit pixel 10 illustrated in FIG. 2. It should be noted that the configuration of the unit pixel 10 is the same as the configuration illustrated in FIG. 2. The vertical scanning unit 4 illustrated in FIG. 4 includes a row selection unit 210, level shift circuit units 211, 212, and 213, and buffer circuit units 214, 215, and 216. The row selection unit 210 selects one of rows of pixels. The level shift circuit units 211, 212, and 213 each convert the level of an externally inputted power supply voltage, which is a single voltage level. The buffer circuit units 214, 215, and 216 buffer voltages obtained through the level conversion by the respective level shift circuit units, and transfer the buffered voltages to the pixel unit 2 as pulse signals. The level shift circuit units 211, 212, and 213 respectively includes step-down level shift circuits 300a, 300b, and 300c and step-up level shift circuits 301a, 301b, and 301c. The step-down level shift circuits 300a, 300b, and 300c each step down the level of the externally inputted power supply voltage, which is a single voltage level. The step-up level shift circuits 301a, 301b, and 301c are isolated from the step-down level shift circuits by wells, and each step up the level of the externally inputted power supply voltage, which is a single level.

A level shift circuit 303a and a buffer circuit 302a are connected to the transfer transistors 13 of the unit pixels 10 in the same row, in sequence in the direction from the row selection unit 210 toward the unit pixels 10. The level shift circuit 303a includes the step-down level shift circuit 300a and the step-up level shift circuit 301a, and shifts the voltage level of a transfer control signal generated in the row selection unit 210. The buffer circuit 302a buffers a signal generated in the level shift circuit 303a. The level shift circuit 303a and the buffer circuit 302a are respectively a first level shift circuit and a first buffer circuit which are disposed between the row selection unit 210 and the gate electrodes of the transfer transistors 13.

Moreover, a level shift circuit 303b and a buffer circuit 302b are connected to the reset transistors 12 of the unit pixels 10 in the same row, in sequence in the direction from the row selection unit 210 toward the pixel units 10. The level shift circuit 303b includes the step-down level shift circuit 300b and the step-up level shift circuit 301b, and shifts the voltage level of a reset control signal generated in the row selection unit 210. The buffer circuit 302b buffers a signal generated in the level shift circuit 303b. The level shift circuit 303b and the buffer circuit 302b are respectively a second level shift circuit and a second buffer circuit which are disposed between the row selection unit 210 and the gate electrodes of the reset transistors 12.

Moreover, a level shift circuit 303c and a buffer circuit 302c are connected to the selection transistors 16 of the unit pixels 10 in the same row, in sequence in the direction from the row selection unit 210 toward the pixel units 10. The level shift circuit 303c includes the step-down level shift circuit 300c and the step-up level shift circuit 301c, and shifts the voltage level of a scanning control signal generated in the row selection unit 210. The buffer circuit 302c buffers a signal generated in the level shift circuit 303c. The level shift circuit 303c and the buffer circuit 302c are respectively a third level shift circuit and a third buffer circuit which are disposed between the row selection unit 210 and the gate electrodes of the selection transistors 16.

The level shift circuits 303a, 303b, and 303c respectively include the step-down level shift circuits 300a, 300b, and 300c on the side where the row selection unit 210 is located. Moreover, the level shift circuits 303a, 303b, and 303c respectively include the step-up level shift circuits 301a, 301b, and 301c on the side where the unit pixels 10 are located.

Moreover, the level shift circuit 303a connected to the transfer transistors 13 is disposed closer to the row selection unit 210 than the level shift circuits 303b and 303c connected to the other transistors (the reset transistors 12 and the selection transistors 16) are. The buffer circuit 302a connected to the transfer transistors 13 is disposed closer to the row selection unit 210 than the buffer circuits 302b and 302c connected to the other transistors (the reset transistors 12 and the selection transistors 16) are. Disposing the level shift circuit 303a and the buffer circuit 302a at the furthest positions from the unit pixels 10 (the pixel unit 2) can prevent a noise from being transmitted to the pixels via a substrate while securing a dynamic range. Here, the noise is generated in the level shift circuit 303a when voltages are being applied to the transfer transistors 13 (i.e., during pixel read). This can avoid the superimposition of a noise on a read signal from a photodiode and thus prevent the degradation of image quality.

Moreover, the level shift circuit 303c connected to the selection transistors 16 is disposed closer to the pixel units 10 than the level shift circuits 303a and 303b connected to the other transistors (the transfer transistors 13 and the reset transistors 102) are. The buffer circuit 302c connected to the selection transistors 16 is disposed closer to the pixel units 10 than the buffer circuits 302a and 302b connected to the other transistors (the transfer transistors 13 and the reset transistors 12) are.

Moreover, the level shift circuit 303a connected to the pixel units 10 in the same row makes up a level shift circuit unit 211 together with the level shift circuits 303a connected to the unit pixels 10 in the other rows. Moreover, the level shift circuit 303b connected to the pixel units 10 in the same row makes up a level shift circuit unit 212 together with the level shift circuits 303b connected to the unit pixels 10 in the other rows. Moreover, the level shift circuit 303c connected to the pixel units 10 in the same row makes up a level shift circuit unit 213 together with the level shift circuits 303c connected to the unit pixels 10 in the other rows.

Likewise, the buffer circuit 302a connected to the unit pixels 10 in the same row makes up a buffer circuit unit 214 together with the buffer circuits 302a connected to the unit pixels 10 in the other rows. Moreover, the buffer circuit 302b connected to the unit pixels 10 in the same row makes up a buffer circuit unit 215 together with the buffer circuits 302b connected to the unit pixels 10 in the other rows. Moreover, the buffer circuit 302c connected to the unit pixels 10 in the same row makes up a buffer circuit unit 216 together with the buffer circuits 302c connected to the unit pixels 10 in the other rows.

Moreover, the digital power supply voltage DVDD1 and the digital ground voltage DVSS1 are supplied to the row selection unit 210.

The digital power supply voltage DVDD1, the digital power supply voltage DVDD2, and the digital ground voltage DVSS2 are supplied to the level shift circuit units 211 and 212.

The digital power supply voltage DVDD1, the digital ground voltage DVSS1, and the digital power supply voltage DVDD2 are supplied to the level shift circuit unit 213.

The digital power supply voltage DVDD2 and the digital ground voltage DVSS2 are supplied to the buffer circuit units 214 and 215.

The digital power supply voltage DVDD2 and the digital ground voltage DVSS1 are supplied to the buffer circuit unit 216.

That is, the solid-state imaging device 1 according to the present embodiment includes the level shift circuit units 211, 212, and 213 and the buffer circuit units 214, 215, and 216.

The level of a voltage (difference between High and Low of a voltage) applied to each gate of the transfer transistor 13, the reset transistor 12, and the selection transistor 16 can be increased by supplying the digital power supply voltages DVDD1 and DVDD2 and the digital ground voltages DVSS1 and DVSS2 to these level shift circuits and buffer circuits. This can expand the operation margin of the pixel unit 2.

For instance, the voltage amplitude of a pulse signal supplied from the level shift circuit unit 211 and the buffer circuit unit 214 to the gate electrode of the transfer transistor 13 is set to be greater than the voltage amplitude of a pulse signal supplied from the level shift circuit unit 212 and the buffer circuit unit 215 to the gate electrode of the reset transistor 12 and the voltage amplitude of a pulse signal supplied from the level shift circuit unit 213 and the buffer circuit unit 216 to the gate electrode of the selection transistor 16.

Moreover, in the solid-state imaging device 1 according to the present embodiment, the buffer circuit units 214, 215, and 216 are disposed next to the unit pixels 10, and the level shift circuit units 211, 212, and 213 are disposed between the row selection unit 210 and the buffer circuit units 214, 215, and 216. The above disposition can prevent a through-current from flowing and prevent the semiconductor substrate 9 from electrically fluctuating, when the level shift circuit units 211, 212, and 213 convert the levels of control signals generated in the row selection unit 210, from the digital power supply voltage DVDD1 to the digital power supply voltage DVDD2. This can prevent the degradation of image quality due to a random noise while expanding the operation margin of a pixel.

Figure 5:
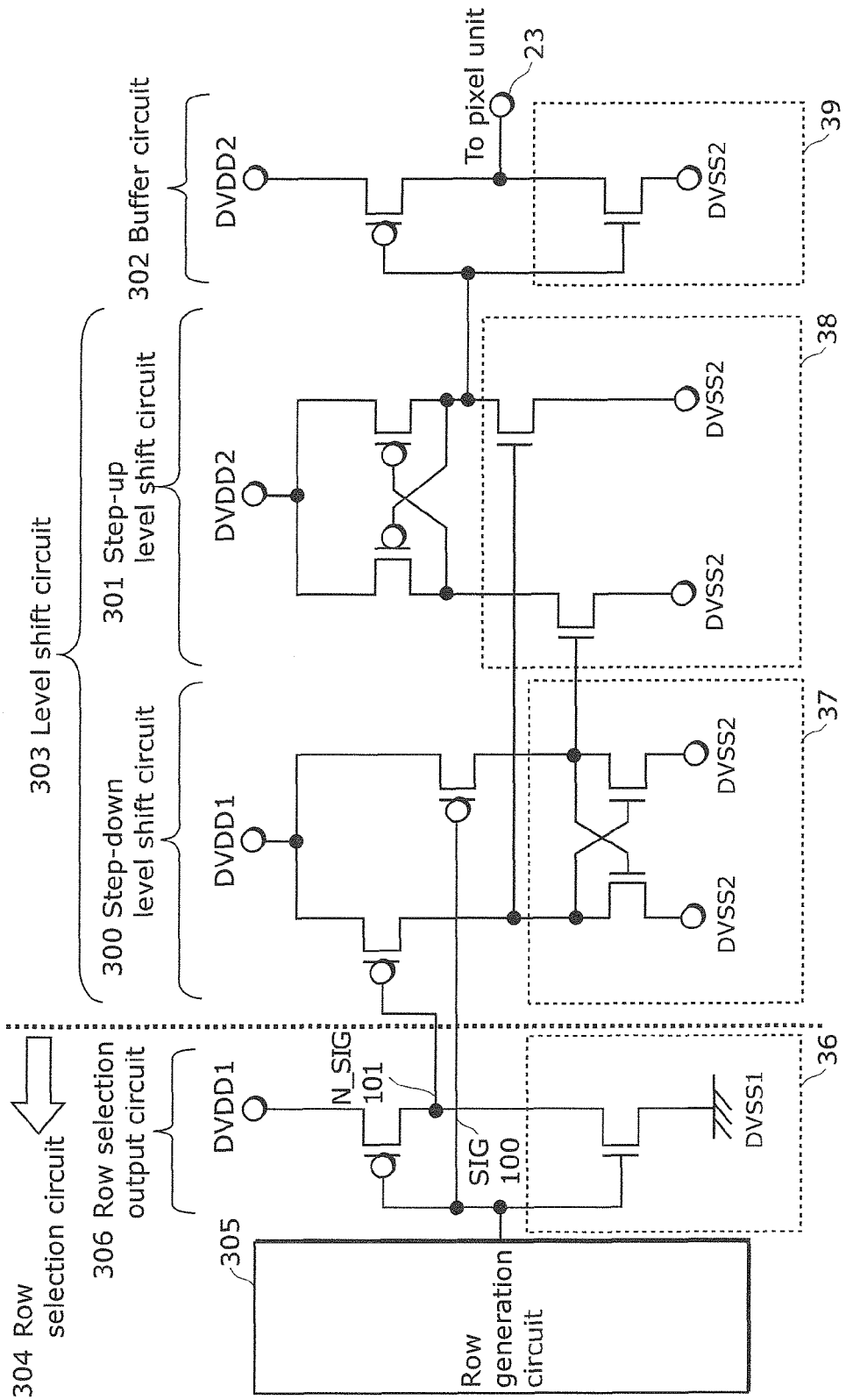
FIG. 5 is a detailed circuit diagram of the level shift circuit and the buffer circuit of a solid-state imaging device according to Embodiment 1.

With reference to FIG. 5, the following describes circuits in one row extracted from the vertical scanning unit 4.

FIG. 5 is a detailed circuit diagram illustrating the level shift circuit and the buffer circuit of the solid-state imaging device according to Embodiment 1. Specifically, FIG. 5 is the detailed circuit diagram illustrating a level shift circuit 303 and a buffer circuit 302. The level shift circuit 303 includes a step-down level shift circuit 300 including the step-down level shift circuits 300a, 300b, and 300c and a step-up level shift circuit 301 including the step-up level shift circuits 301a, 301b, and 301c. The buffer circuit 302 includes the buffer circuits 302a, 302b, and 302c.

With reference to FIG. 5, a row selection circuit 304 equivalent to one of the rows of the row selection circuit 210 includes a row generation circuit 305 for generating a signal SIG 100 in a corresponding one of the rows and a row selection output circuit 306 for outputting the signal SIG100 generated in the row generation circuit 305 and a signal N_SIG101 obtained by inverting the signal SIG100.

The signals SIG100 and N_SIG101 outputted from the row selection output circuit 306 are inputted to the step-down level shift circuit 300. The step-down level shift circuit 300 then shifts a Low voltage level from DVSS1 (=0 V) to DVSS2 (<0 V). The step-up level shift circuit 301 shifts a High voltage level from DVDD1 (< DVDD2) to DVDD2. DVSS2 and DVDD2 which are signals whose voltage levels have been shifted are supplied as signals 23 to the unit pixels 10 (pixel unit 2) through the buffer circuit 302.

The level shift circuit 303 including the step-down level shift circuit 300 and the step-up level shift circuit 301 and the buffer circuit 302 are disposed in sequence in the direction from the row selection circuit 304 toward the unit pixels 10. This can decrease a voltage step from the row selection circuit 304 to the step-down level shift circuit 300 and a voltage step from the step-down level shift circuit 300 to the step-up level shift circuit 301. This can decrease the size of a metal oxide semiconductor (MOS) of each level shift circuit, expand the operation margin of the circuit, suppress a consumption current, and reduce the circuit areas of the level shift circuit units 211, 212, and 213.

Figure 6:
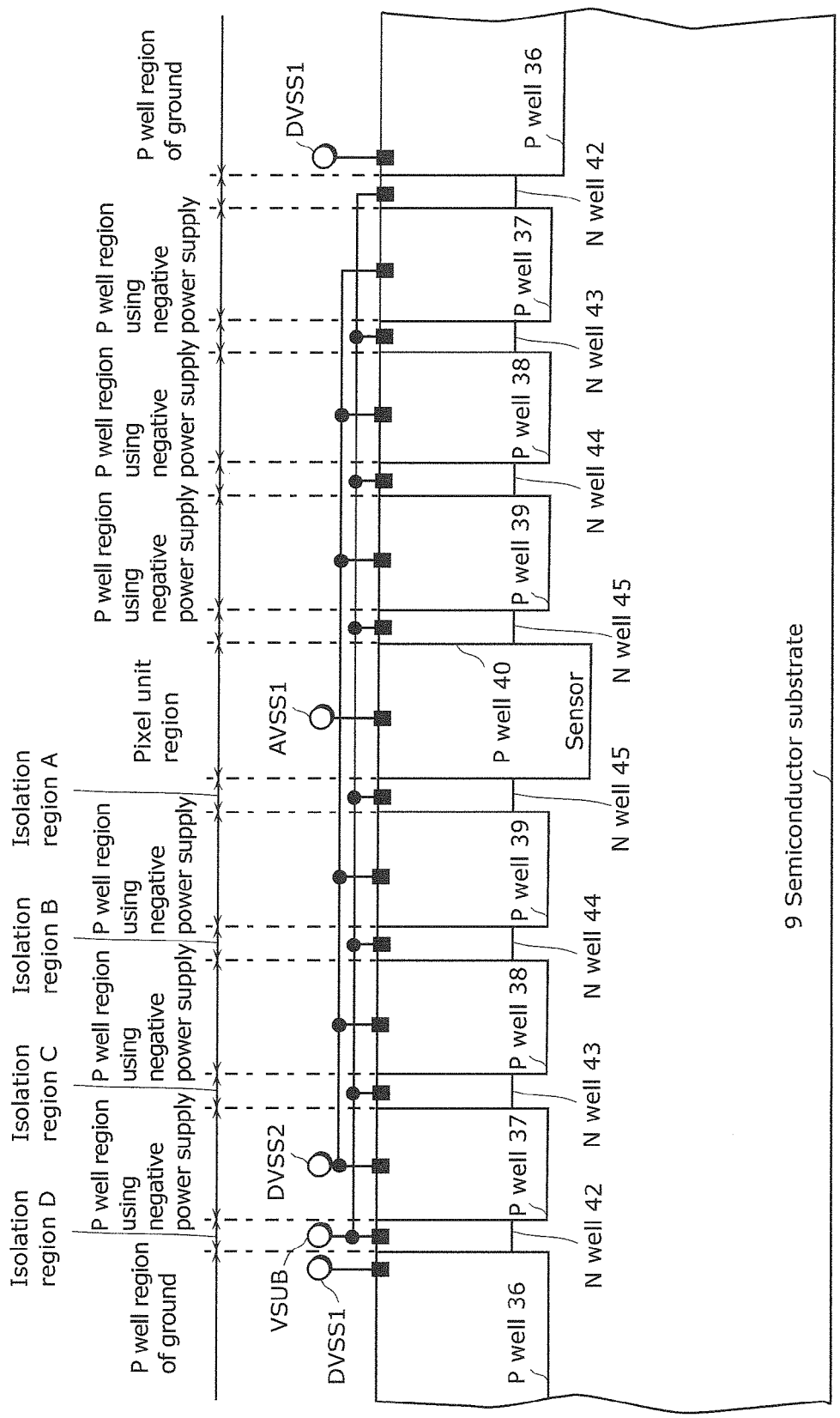
FIG. 6 is a cross-sectional view of the structure of a solid-state imaging device according to Embodiment 1.

FIG. 6 is a cross-sectional view of the structure of the solid-state imaging device according to Embodiment 1. With reference to FIG. 6, a P well 40 for a sensor is formed in the whole pixel unit 2 on the semiconductor substrate 9, and the analog ground voltage AVSS1 is applied to the P well 40. An N well 45 is formed around the P well 40. A P well 39 is formed around the N well 45. An N well 44 is formed around the P well 39, A P well 38, an N well 43, a P well 37, an N well 42, and a p well 36 are formed in this order.

Moreover, the circuits illustrated in FIG. 5 are respectively formed in the P wells 36, 37, 38, and 39. Specifically, the step-down level shift circuit 300 is formed in the P well 37. The step-up level shift circuit 301 is formed in the P well 38. The buffer circuit 302 is formed in the P well 39.

It should be noted that the digital ground voltage DVSS2 is applied to the P wells 37, 38, and 39. The VSUB voltage is applied to the N wells 42, 43, 44, and 45. The digital ground voltage DVSS1 is applied to the P well 36 where the row selection unit 210 is formed. The relationship: digital ground voltage $DVSS2 \leq 0$ holds. The potential may be a negative potential.

According to the above configuration, the wells for the step-down level shift circuit 300 and the step-up level shift circuit 301 are separated. Moreover, the P well region of the pixel unit 2 and the P well region of the level shift circuit 303 are separated by the N wells. Therefore, even if a drive voltage difference required for the solid-state imaging device is large, the provision of the step-down level shift circuit 300 and the step-up level shift circuit 301 decreases a noise power due to a through-current generated in the step-down and step-up level shift circuits. This can suppress a noise to be transmitted to the pixel unit 2 through the semiconductor substrate 9. Moreover, deterioration in reliability due to a large voltage difference can be suppressed.

It should be noted that in the present embodiment, the P wells 36, 37, 38, and 39 are the regions where the circuits illustrated in FIG. 5 are formed. However, other configuration is also possible as long as it is a well structure for applying a negative voltage to the pixel unit 2.

The solid-state imaging device 1 according to Embodiment 1 described with reference to the drawings can reduce the voltage of a peripheral circuit unit and suppress power consumption by supplying power supply voltages from outside the semiconductor substrate 9 and providing the step-up level shift circuit 301 or the step-down level shift circuit 300 in the semiconductor substrate 9. Meanwhile, a high voltage is applied to the pixel unit 2, and the level of the charge detection unit 14 is reset at a high voltage. This can reduce a random noise while securing a dynamic range.

The following further describes the details of the advantages of the solid-state imaging device 1 according to Embodiment 1.

A level shift circuit of a general solid-state imaging device has a buffer function. Meanwhile, in the solid-state imaging device 1 according to the present embodiment, the buffer circuit 302 and the level shift circuit 303 are provided as different circuits. Therefore, the circuit size of the level shift circuit 303 can be reduced. A through-current in the level shift circuit 303 can be suppressed. The operation voltage of the level shift circuit 303 can be increased by the expansion of operation margin resulted from reduction in IR drop. Accordingly, power consumption can be suppressed.

Furthermore, the same power supply and ground are used for the buffer circuit 302 and the level shift circuit 303. However, separation of main lines for a power supply and the separation of main lines for a ground can prevent currents from converging at one place. This can prevent the degradation of image quality due to a random noise and a random horizontal line noise.

Furthermore, the buffer circuit 302 and the level shift circuit 303 are provided as different circuits. The buffer circuit 302 is disposed between the unit pixels 10 and the level shift circuit 303. By so doing, the buffer circuit 302 for directly driving the solid-state imaging device 1 can be disposed near the unit pixels 10 (pixel unit 2) while locating away from the pixels, the level shift circuit 303 where a through-current occurs. Moreover, the buffer circuit 302 for directly driving the solid-state imaging device 1 can be disposed near the unit pixels 10 (pixel unit 2) while locating away from the unit pixels 10 (pixel unit 2), both of the step-down and step-up level shift circuits of the level shift circuit 303.

The level shift circuit 303 connected to the transfer transistors 13 is disposed closer to the row selection unit 210 than the level shift circuits 303 connected to the other transistors (the reset transistors 12 and selection transistors 16) are. That is, the level shift circuit 303 connected to the transfer transistors 13 is disposed at the farthest position from the unit pixels 10 (pixel unit 2). This can simultaneously secure the dynamic range and prevent a noise, generated in the level shift circuit 303 connected to the transfer transistors 13 when voltages are applied to the transfer transistors 13 (during pixel read), from being transmitted to the pixels via the substrate. This can avoid the superimposition of a noise on a read signal from the photodiode 11. Therefore, the degradation of image quality can be prevented.

Furthermore, the wells for the step-down level shift circuit 300 and the step-up level shift circuit 301 are separated. The P well region of the pixel unit 2 and the P well region of the level shift circuit 303 are separated by the N wells. By so doing, even if a drive voltage difference required for a solid-state imaging device is large, a noise power due to through-currents generated in the step-down and step-up level shift circuits is decreased by using the step-down and step-up level shift circuits. Therefore, a noise to be transmitted to the pixel unit 2 via the semiconductor substrate 9 can be suppressed. Moreover, deterioration in reliability due to the large voltage difference can be suppressed.

Furthermore, the level shift circuit 303 including the step-down level shift circuit 300 and the step-up level shift circuit 301 and the buffer circuit 302 are disposed in sequence in the direction from the row selection unit 210 toward the unit pixels 10. This can reduce a voltage step from the row selection circuit 304 to the step-down level shift circuit 300 and a voltage step from the step-down level shift circuit 300 to the step-up level shift circuit 301. Therefore, the MOS size of each level shift circuit can be reduced. The operation margin of the circuit can be expanded. Power consumption can be suppressed. The circuit areas of the level shift circuit units 211, 212, and 213 can be reduced.

Embodiment 2

The following mainly describes differences from Embodiment 1 as to the configuration and operation of a solid-state imaging device according to Embodiment 2.

Figure 7:
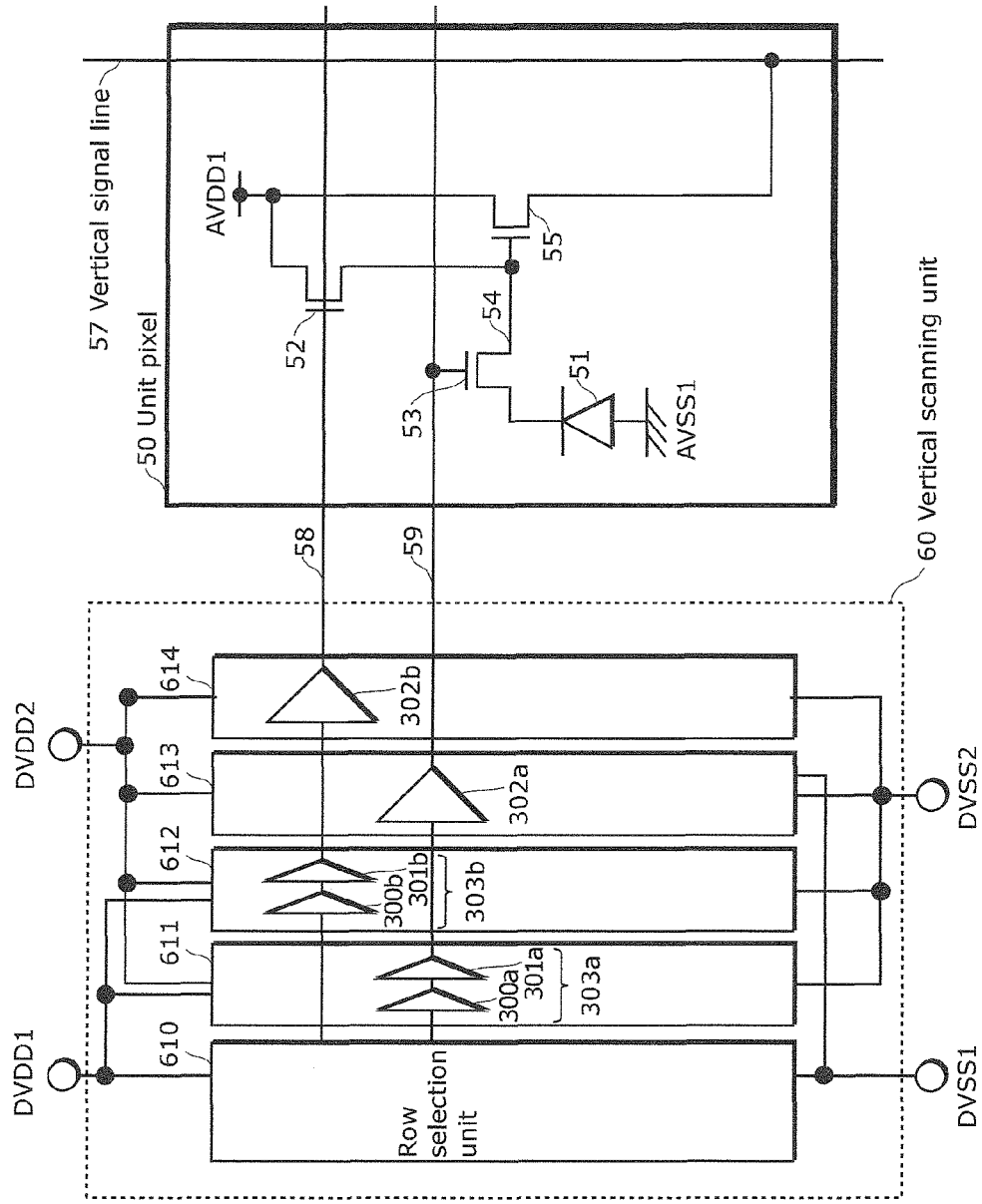
FIG. 7 is a detailed block diagram illustrating a unit pixel and the vertical scanning unit of a solid-state imaging device according to Embodiment 2.

FIG. 7 is a detailed block diagram illustrating a unit pixel and the vertical scanning unit of a solid-state imaging device according to Embodiment 2. In FIG. 7, a unit pixel 50 includes a photodiode (receiving unit) 51, a transfer transistor 53, a charge detection unit 54, an amplifier transistor 55, a reset transistor 52 for resetting the potential of the charge detection unit 54, a vertical signal line 57, a terminal to which an analog power supply voltage AVDD1 is supplied, and a terminal to which an analog ground voltage AVSS1 is supplied.

A vertical scanning unit 60 generates a reset control signal for controlling the reset transistor 52 via a reset control line 58 and generates a transfer control signal for controlling the transfer transistor 53 via a transfer control line 59.

Moreover, the relationship between a digital power supply voltage DVDD1 and a digital power supply voltage DVDD2, which are supplied to the vertical scanning unit 60 is DVDD1<DVDD2. The relationship between a digital ground voltage DVSS1 and a digital ground voltage DVSS2, which are supplied to the vertical scanning unit 60 is DVSS2≤DVSS1.

Moreover, the relationship between the digital power supply voltage DVDD2 and the analog power supply voltage AVDD1 is DVDD2≥AVDD1. The relationship between the digital ground voltage DVSS2 and the analog ground voltage AVSS1 is DVSS2≤AVSS1.

Moreover, the vertical scanning unit 60, which generates reset control signals and transfer control signals for the unit pixels 50, includes a row selection unit 610, level shift circuit units 611 and 612, and buffer circuit units 613 and 614. The row selection unit 610 selects one of rows of pixels in the vertical direction. The level shift circuit units 611 and 612 each shift the voltage level of a selection signal generated in the row selection unit 610. The buffer circuit units 613 and 614 buffer signals generated in the level shift circuit units.

FIG. 8 is a drive timing chart for the solid-state imaging device according to Embodiment 2. Specifically, FIG. 8 is a timing chart relating to the reset control line 58 and the transfer control line 59 illustrated in FIG. 7.

In pixel read operation, reset control signals to be applied to the gate electrodes of the reset transistors 12 are set to DVDD2 (≥AVDD1) at time T1, and are set to DVSS2 (≤AVSS1) at time T2. A voltage change in the reset control line 58 from time T1 to time T2 resets the voltages of the charge detection units 54 to be identical to AVDD1.

Transfer control signals to be applied to the gate electrodes of the transfer transistors 53 are set to DVDD2 (≥AVDD1) at time T3, and are set to DVSS2 (≤AVSS1) at time T4. A voltage change in the transfer control line 59 from time T3 to time T4 reads signals from the photodiodes 51. The read operation is completed by performing a series of operations described above.

As described with reference to the drawings, the solid-state imaging device according to the present embodiment is different from the solid-state imaging device 1 according to Embodiment 1 in that the selection transistor 16 is not provided in the unit pixel 50. The buffer circuit units 613 and 614 are disposed next to the unit pixels 50 where the selection transistors 16 are not disposed. Moreover, the level shift circuit units 611 and 612 are disposed between the row selection unit 610 and the buffer circuit units 613 and 614. The above disposition can achieve the same advantages obtained in Embodiment 1.

Embodiment 3

Figure 9A:
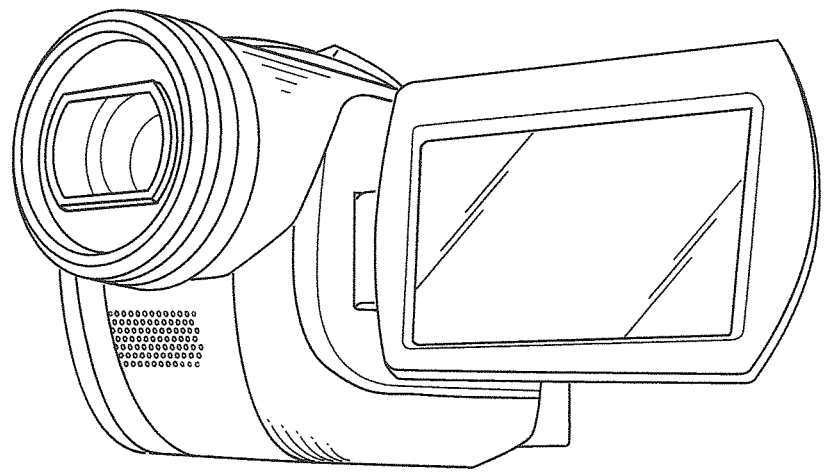
FIG. 9A is an outline drawing illustrating an example of a video camera.
Figure 9B:
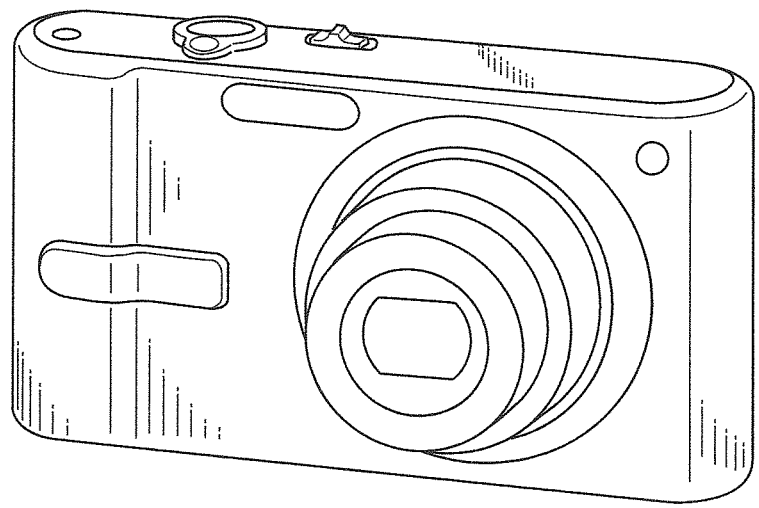
FIG. 9B is an outline drawing illustrating an example of a digital still camera.

The solid-state imaging devices according to Embodiments 1 and 2 are excellent for using as the imaging device (image inputting device) of an imaging apparatus such as a video camera in FIG. 9A, a digital still camera in FIG. 9B, or a camera module for a mobile device including a cellular phone.

Figure 10:
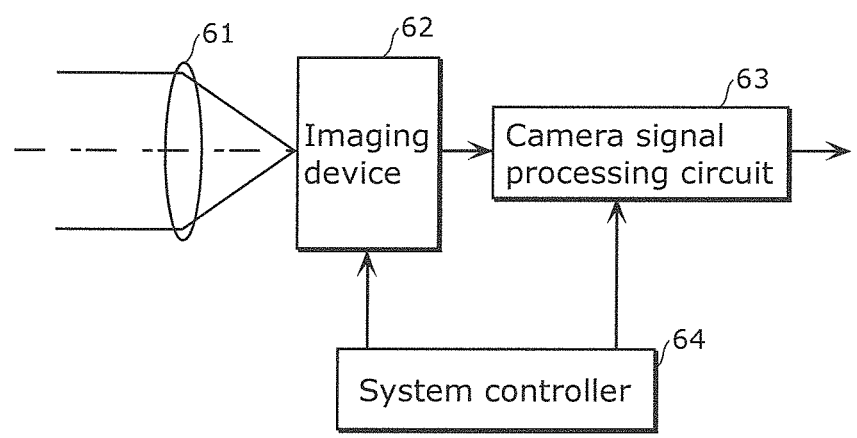
FIG. 10 is a block diagram illustrating an example of the configuration of an imaging apparatus according to the present disclosure.
Figure 11:
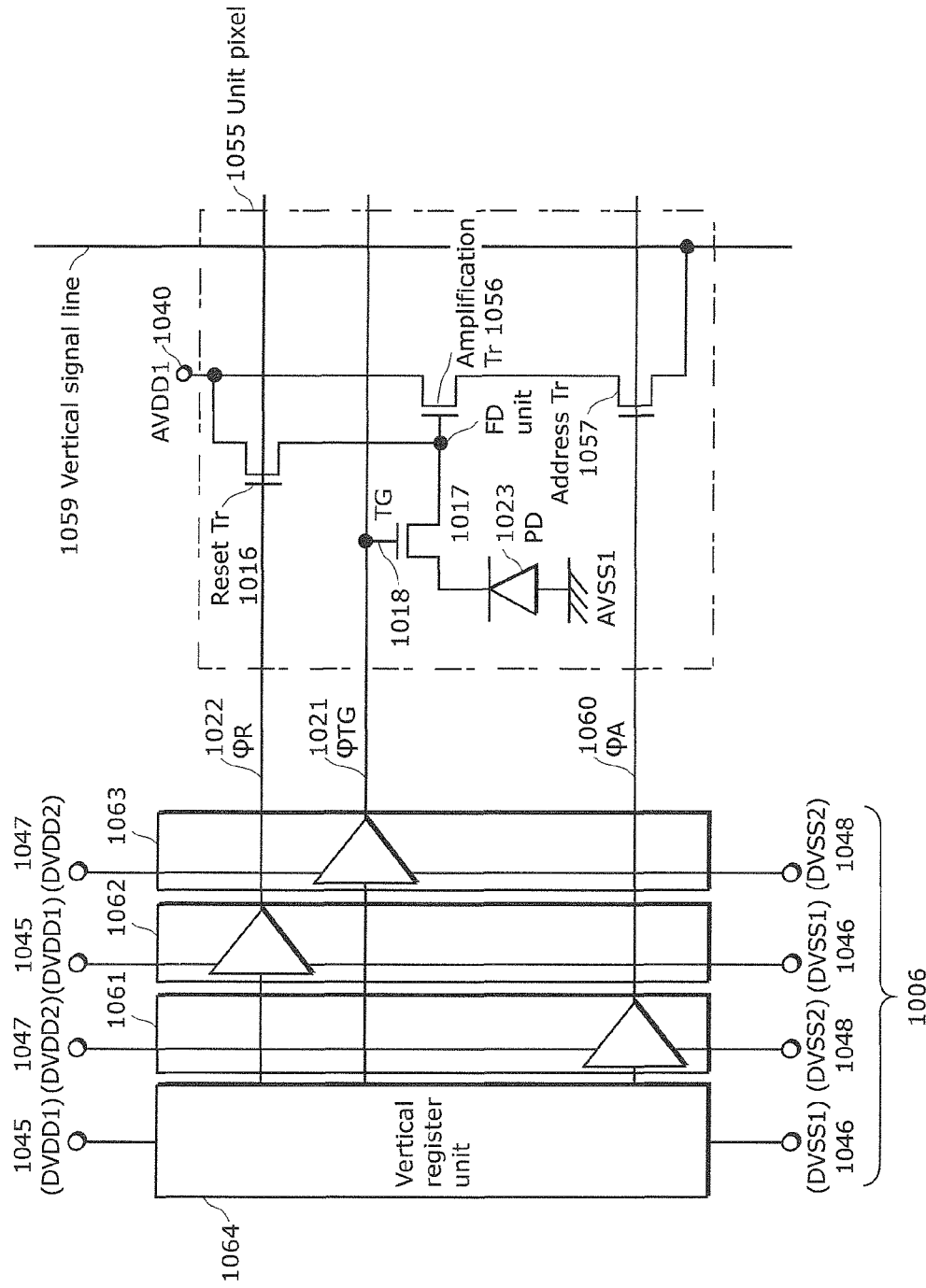
FIG. 11 is a block diagram illustrating a conventional solid-state imaging device.

FIG. 10 is a block diagram illustrating an example of the configuration of an imaging apparatus. As FIG. 10 illustrates, the imaging apparatus according to the present embodiment includes an optical system including a lens 61, an imaging device 62, a camera signal processing circuit 63, and a system controller 64. The lens 61 causes image light from a subject to be formed on an imaging plane of the imaging device 62. The imaging device 62 outputs a pixel signal obtained by converting, on a per-pixel basis, the image light formed on the imaging plane by the lens 61, into an electric signal. The solid-state imaging device according to Embodiment 1 or 2 is used as the imaging device 62.

The camera signal processing circuit 63 performs various signal processing on an image signal outputted from the imaging device 62. The system controller 64 performs control for the imaging device 62 and the camera signal processing circuit 63.

Thus, the imaging apparatus according to the present embodiment includes the imaging device 62 which can prevent the degradation of image quality due to a random noise while expanding the operation margin of a pixel.

The solid-state imaging devices and imaging apparatus according to the present disclosure were described based on the embodiments. However, the solid-state imaging devices and imaging apparatus according to the present disclosure are not limited to the above embodiments. The present invention includes other embodiments which can be achieved through combination of arbitrary structural elements in the embodiments, an modification obtained by making various changes, which those skilled in the art would conceive, to the embodiments without departing from a scope of the present invention, or various devices including the solid-state imaging device or imaging apparatus according to the present disclosure.

INDUSTRIAL APPLICABILITY

The present invention is useful for solid-state imaging devices, and is particularly useful for a digital still camera, a digital video camera, and others which require high speed and high image quality.

The invention claimed is:

1. A solid-state imaging device comprising:
a pixel unit in which unit pixels are arranged in rows and columns on a semiconductor substrate,
each of the unit pixels including, on the semiconductor substrate:
a receiving unit configured to store signal charges obtained by photoelectrically converting incident light;
a transfer transistor for transferring the signal charges stored in the receiving unit, in accordance with a pulse signal applied to a gate electrode of the transfer transistor;
a charge detection unit configured to temporarily store the transferred signal charges; and
a reset transistor for resetting the signal charges stored in the charge detection unit, in accordance with a pulse signal applied to a gate electrode of the reset transistor; and
a vertical scanning unit formed in and on the semiconductor substrate configured to drive the pixel unit by supplying the pulse signal to the pixel unit,
the vertical scanning unit including:

a row selection unit configured to select one of the rows of the unit pixels;

at least one level shift circuit for converting a level of an externally inputted power supply voltage, the level being a single voltage level; and at least one buffer circuit for buffering a voltage whose level has been converted by the at least one level shift circuit, and transferring the buffered voltage as the pulse signal to the pixel unit, each of the at least one level shift circuit including:

a step-down level shift circuit which steps down an externally inputted power supply voltage; and a step-up level shift circuit which is isolated from the step-down level shift circuit by a well, and steps up an externally inputted power supply voltage.

2. The solid-state imaging device according to claim 1, wherein the vertical scanning unit includes:

a first level shift circuit of the at least one level shift circuit and a first buffer circuit of the at least one buffer circuit, the first buffer circuit supplying, as the pulse signal, a voltage whose level has been converted by the first level shift circuit, to the gate electrode of the transfer transistor, the first level shift circuit and the first buffer circuit being disposed between the row selection unit and the gate electrode of the transfer transistor; and a second level shift circuit of the at least one level shift circuit and a second buffer circuit of the at least one buffer circuit, the second buffer circuit supplying, as the pulse signal, a voltage whose level has been converted by the second level shift circuit, to the gate electrode of the reset transistor, the second level shift circuit and the second buffer circuit being disposed between the row selection unit and the gate electrode of the reset transistor, and the first level shift circuit is disposed closer to the row selection unit than the second level shift circuit is.

3. The solid-state imaging device according to claim 2, wherein a voltage amplitude of the pulse signal supplied from the first buffer circuit to the gate electrode of the transfer transistor is set to be greater than a voltage amplitude of the pulse signal supplied from the second buffer circuit to the gate electrode of the reset transistor.

4. The solid-state imaging device according to claim 2, wherein the pixel unit further includes, on the semiconductor substrate, selection transistors for determining an output timing of a pixel signal to one of vertical signal lines respectively provided for the columns of the unit pixels, in accordance with a pulse signal applied to a gate electrode of each of the selection transistors, the pixel signal corresponding to the signal charges stored in the charge detection unit, the vertical scanning unit includes a third level shift circuit of the at least one level shift circuit and a third buffer circuit of the at least one buffer circuit, the third level shift circuit and the third buffer circuit being disposed between the row selection unit and the gate electrode of the selection transistor, the first level shift circuit is disposed closer to the row selection unit than the second level shift circuit and the third level shift circuit are, and the third level shift circuit is disposed closer to the pixel unit than the first level shift circuit and the second level shift circuit are.

5. The solid-state imaging device according to claim 4, wherein a voltage amplitude of the pulse signal supplied from the first level shift circuit and the first buffer circuit to the gate electrode of the transfer transistor is set to be greater than a voltage amplitude of the pulse signal supplied from the second level shift circuit and the second buffer circuit to the gate electrode of the reset transistor and a voltage amplitude of the pulse signal supplied from the third level shift circuit and the third buffer circuit to the gate electrode of the selection transistor.

6. The solid-state imaging device according to claim 1, wherein the step-down level shift circuit, the step-up level shift circuit, and the at least one buffer circuit are disposed in sequence in a direction from the row selection unit toward the unit pixels.

7. An imaging apparatus comprising the sold-state imaging device according to claim 1.

* * * * *